(12) United States Patent
Zhang

(10) Patent No.: US 10,445,067 B2
(45) Date of Patent: *Oct. 15, 2019

(54) CONFIGURABLE PROCESSOR WITH IN-PACKAGE LOOK-UP TABLE

(71) Applicant: Guobiao Zhang, Corvallis, OR (US)

(72) Inventor: Guobiao Zhang, Corvallis, OR (US)

(73) Assignees: HangZhou HaiCun Information Technology Co., Ltd., HangZhou, ZheJiang (CN); Guobiao Zhang, Corvallis, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/203,599

(22) Filed: Nov. 28, 2018

(65) Prior Publication Data

US 2019/0114138 A1    Apr. 18, 2019

Related U.S. Application Data

(63) Continuation-in-part of application No. 15/588,642, filed on May 6, 2017.

(30) Foreign Application Priority Data

May 6, 2016  (CN) ........................ 2016 1 0301645
May 5, 2017  (CN) ........................ 2017 1 0310865

(51) Int. Cl.
| | | |
|---|---|---|
| *G06F 7/48* | (2006.01) | |
| *G06F 7/498* | (2006.01) | |
| *G06F 7/544* | (2006.01) | |
| *H03K 19/177* | (2006.01) | |

(52) U.S. Cl.
CPC ............ *G06F 7/4988* (2013.01); *G06F 7/544* (2013.01); *H03K 19/17728* (2013.01)

(58) Field of Classification Search
None
See application file for complete search history.

(56) References Cited

U.S. PATENT DOCUMENTS

| | | |
|---|---|---|
| 4,870,302 A | 9/1989 | Freeman |
| 5,046,038 A | 9/1991 | Briggs et al. |
| 5,060,182 A | 10/1991 | Briggs et al. |
| 5,604,499 A | 2/1997 | Miyagoshi et al. |
| 5,835,396 A | 11/1998 | Zhang |
| 5,901,274 A | 5/1999 | Oh |
| 5,954,787 A | 9/1999 | Eun |
| 6,181,355 B1 | 1/2001 | Brethour et al. |
| 6,263,470 B1 | 7/2001 | Hung et al. |
| 7,028,247 B2 | 4/2006 | Lee |

(Continued)

OTHER PUBLICATIONS

Harrison et al., "The Computation of Transcendental Functions on the IA-64 Architecture", Intel Technical Journal, Q4, 1999.

*Primary Examiner* — David H Malzahn

(57) ABSTRACT

A configurable processor comprises a memory die and a logic die. The memory die comprises a programmable memory array for storing a look-up table (LUT) for a mathematical function, while the logic die comprises an arithmetic logic circuit (ALC) for performing at least an arithmetic operation on selected data from the LUT, wherein said mathematical function includes more operation than the arithmetic operations performable by the ALC. Complex mathematical functions can be implemented and configured.

20 Claims, 8 Drawing Sheets

(56) References Cited

U.S. PATENT DOCUMENTS

| | | | |
|---|---|---|---|
| 7,206,410 B2 | 4/2007 | Bertoni et al. | |
| 7,366,748 B1 | 4/2008 | Tang et al. | |
| 7,472,149 B2 | 12/2008 | Endo | |
| 7,512,647 B2 | 3/2009 | Wilson et al. | |
| 7,574,468 B1 | 4/2009 | Rayala | |
| 7,539,927 B2 | 5/2009 | Lee et al. | |
| 7,558,812 B1* | 7/2009 | Padalia | H03K 19/177 708/235 |
| 7,634,524 B2 | 12/2009 | Okutani et al. | |
| 7,962,543 B2 | 6/2011 | Schulte et al. | |
| 8,203,564 B2 | 6/2012 | Jiao et al. | |
| 8,273,610 B2* | 9/2012 | Or-Bach | H01L 21/6835 438/142 |
| 8,487,948 B2 | 7/2013 | Kai et al. | |
| 9,015,452 B2 | 4/2015 | Dasgupta | |
| 9,136,153 B2* | 9/2015 | Or-Bach | G11C 8/16 |
| 9,207,910 B2 | 12/2015 | Azadet et al. | |
| 9,225,501 B2 | 12/2015 | Azadet | |
| 9,465,580 B2 | 10/2016 | Pineiro et al. | |
| 9,606,796 B2 | 3/2017 | Lee et al. | |
| 2004/0044710 A1 | 3/2004 | Harrison et al. | |
| 2006/0106905 A1 | 5/2006 | Chren, Jr. | |
| 2010/0289064 A1* | 11/2010 | Or-Bach | H01L 21/26506 257/209 |
| 2012/0129301 A1* | 5/2012 | Or-Bach | H01L 21/6835 438/129 |
| 2012/0248595 A1* | 10/2012 | Or-Bach | H01L 21/6835 257/706 |
| 2014/0067889 A1 | 3/2014 | Mortensen | |
| 2017/0237440 A1* | 8/2017 | Zhang | G06F 7/4876 708/503 |
| 2017/0322770 A1* | 11/2017 | Zhang | G06F 7/483 |
| 2017/0322771 A1* | 11/2017 | Zhang | G06F 7/4988 |
| 2017/0322774 A1* | 11/2017 | Zhang | H03K 19/17728 |
| 2017/0322906 A1* | 11/2017 | Zhang | G06F 15/82 |
| 2017/0323041 A1* | 11/2017 | Zhang | G06F 17/5022 |
| 2017/0323042 A1* | 11/2017 | Zhang | G06F 17/5022 |
| 2017/0329548 A1* | 11/2017 | Zhang | G06F 3/0617 |
| 2019/0114138 A1* | 4/2019 | Zhang | H03K 19/17728 |
| 2019/0114170 A1* | 4/2019 | Zhang | G06F 9/3004 |

* cited by examiner

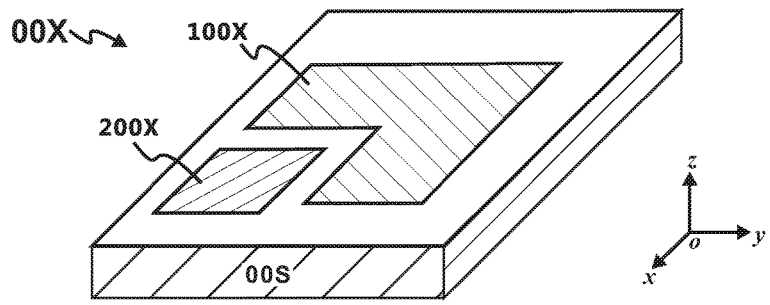
Fig. 1A
(Prior Art)
| FUNC | LUT SIZE | Taylor Series |
|---|---|---|
| CBRT | 24 kbit | 6 |
| EXP | 2 kbit | 5 |
| LN | 24 kbit | 6 |
| SIN | 6 kbit | 9 |
| COS | 6 kbit | 9 |
| TAN | 0 | 15 |
| ATAN | 0 | 22 |
Fig. 1B
(Prior Art)
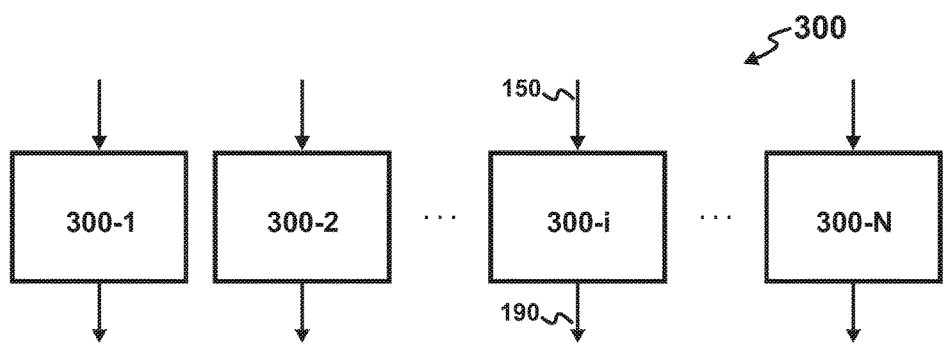
Fig. 2A

| Precision | Bit | LUT Size | Taylor Series |
|---|---|---|---|
| Half Precision | 16-bit | 1Mbit | 0 |
| Single Precision | 32-bit | 4Mbit | 1 |
| Double Precision | 64-bit | 12Mbit | 2 |
| Extended Double Precision | 80-bit | 20Mbit | 3 |

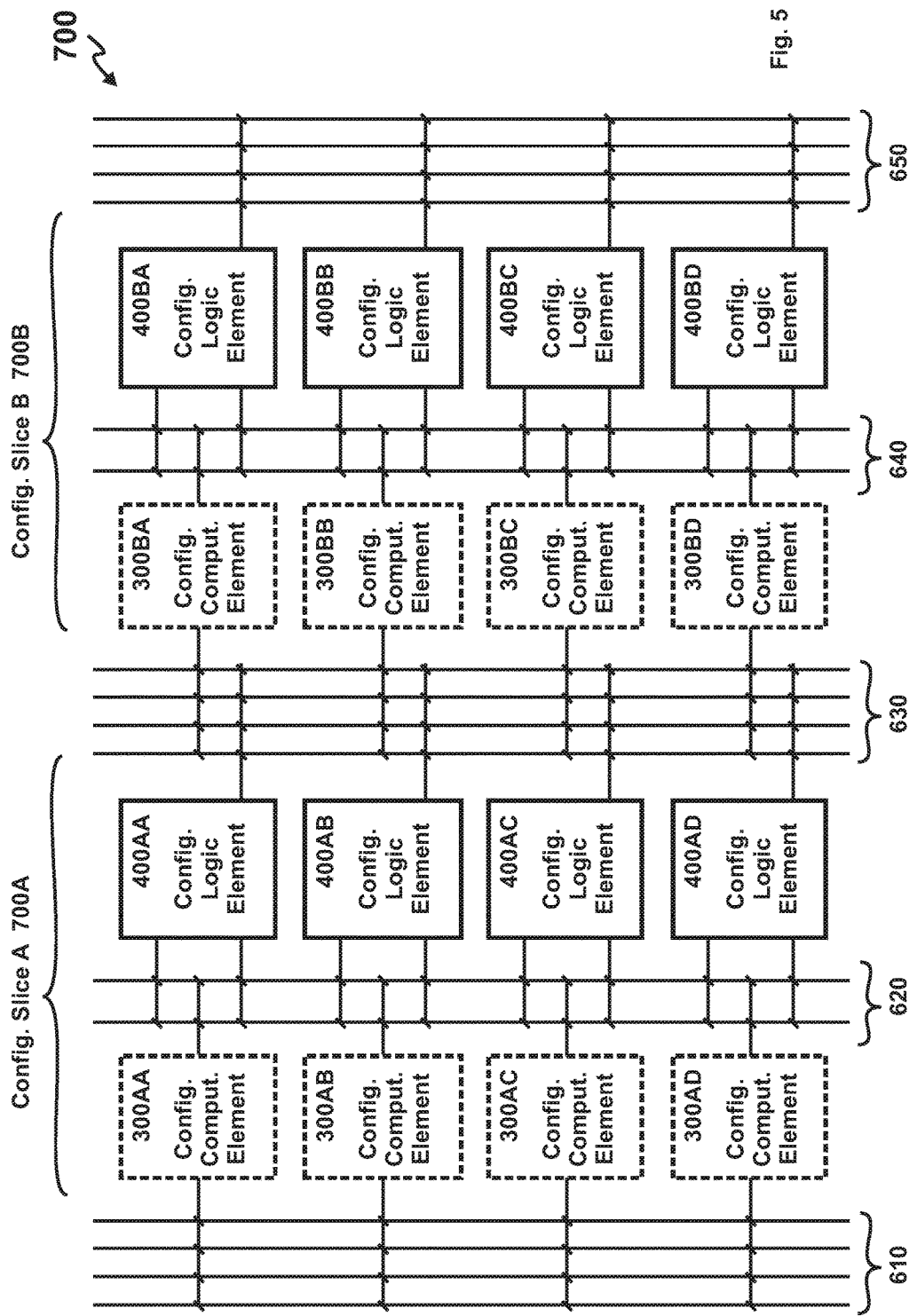

CONFIGURABLE PROCESSOR WITH IN-PACKAGE LOOK-UP TABLE

CROSS-REFERENCE TO RELATED APPLICATIONS

This application is a continuation-in-part of U.S. patent application Ser. No. 15/588,642, filed May 6, 2017, which claims priority from Chinese Patent Application 201610301645.8, filed May 6, 2016; Chinese Patent Application 201710310865.1, filed May 5, 2017, in the State Intellectual Property Office of the People's Republic of China (CN), the disclosure of which are incorporated herein by references in their entireties.

BACKGROUND

1. Technical Field of the Invention

The present invention relates to the field of integrated circuit, and more particularly to processors.

2. Prior Art

Conventional processors use logic-based computation (LBC), which carries out computation primarily with logic circuits (e.g. XOR circuit). Logic circuits are suitable for arithmetic functions, whose operations consist of basic arithmetic operations only, i.e. addition, subtraction and multiplication. However, logic circuits are not suitable for non-arithmetic functions, whose operations are more than the above arithmetic operations performable by the conventional logic circuits. Exemplary non-arithmetic functions include transcendental functions and special functions. Non-arithmetic functions are computationally hard and their hardware implementation has been a major challenge.

A complex function is a non-arithmetic function with multiple independent variables (independent variable is also known as input variable or argument). It can be expressed as a combination of basic functions. A basic function is a non-arithmetic function with a single independent variable. Exemplary basic functions include basic transcendental functions, such as exponential function (exp), logarithmic function (log), trigonometric functions (sin, cos, tan, atan) and others.

For the conventional processors, all complex functions and most basic functions are implemented by software; only a small number of basic functions (e.g. basic algebraic functions and basic transcendental functions) are implemented by hardware, which are referred to as built-in functions. These built-in functions are realized by a combination of arithmetic operations and look-up tables (LUT). For example, U.S. Pat. No. 5,954,787 issued to Eun on Sep. 21, 1999 taught a method for generating sine/cosine functions using look-up tables; U.S. Pat. No. 9,207,910 issued to Azadet et al. on Dec. 8, 2015 taught a method for calculating a power function using LUTs.

Realization of built-in functions is further illustrated in FIG. 1A. A conventional processor 00X generally comprises a logic circuit 100X and a memory circuit 200X. The logic circuit 100X comprises an arithmetic logic unit (ALU) for performing arithmetic operations, whereas the memory circuit 200X stores an LUT for the built-in function. To obtain a desired precision, the built-in function is approximated to a polynomial of a sufficiently high order. The LUT 200X stores the coefficients of the polynomial; and the ALU 100X calculates the polynomial. Because the ALU 100X and the LUT 200X are formed side-by-side on a semiconductor substrate 00S, this type of horizontal integration is referred to as two-dimensional (2-D) integration.

The 2-D integration puts stringent requirements on the manufacturing process. As is well known in the art, the memory transistors in the LUT 200X are vastly different from the logic transistors in the ALC 100X. The memory transistors have stringent requirements on leakage current, while the logic transistors have stringent requirements on drive current. To form high-performance memory transistors and high-performance logic transistors at the same time is a challenge.

The 2-D integration also limits computational density and computational complexity. Computation has been developed towards higher computational density and greater computational complexity. The computational density, i.e. the computational power (e.g. the number of floating-point operations per second) per die area, is a figure of merit for parallel computation. The computational complexity, i.e. the total number of built-in functions supported by a processor, is a figure of merit for scientific computation. For the 2-D integration, inclusion of the LUT 200X increases the die size of the conventional processor 00X and lowers its computational density. This has an adverse effect on parallel computation. Moreover, because the ALU 100X, as the primary component of the conventional processor 00X, occupies a large die area, the LUT 200X is left with only a small die area and therefore, supports few built-in functions. FIG. 1B lists all built-in transcendental functions supported by an Intel Itanium (IA-64) processor (referring to Harrison et al. "The Computation of Transcendental Functions on the IA-64 Architecture", Intel Technical journal, Q4 1999, hereinafter Harrison). The IA-64 processor supports a total of 7 built-in transcendental functions, each using a relatively small LUT (from 0 to 24 kb) in conjunction with a relatively high-order Taylor series (from 5 to 22).

The LBC-based processor 00X suffers one drawback. Because different logic circuits are used to realize different built-in functions, the processor 00X is fully customized. In other words, once its design is complete, the processor 00X can only realize a fixed set of pre-defined built-in functions. Apparently, configurable computation is more desirable, where a same hardware can realize different mathematical functions under the control of a set of configuration signals.

In the past, configurable logic, i.e. a same hardware realizes different logics under the control of a set of configuration signals, was realized by a configurable gate array, which is also known as field-programmable gate array (FPGA), complex programmable logic device (CPLD), or other names. U.S. Pat. No. 4,870,302 issued to Freeman on Sep. 26, 1989 (hereinafter Freeman) discloses a configurable gate array. It comprises an array of configurable logic elements and a hierarchy of configurable interconnects that allow the configurable logic elements to be wired together. In the prior-art configurable gate arrays, only logic functions are configurable, but mathematical functions are not configurable. A small number of mathematical functions (i.e. built-in functions) are realized in fixed computing elements, which are part of hard blocks. Namely, the circuits realizing these built-in functions are fixedly connected and are not subject to change by programming. Apparently, fixed computing elements would limit further applications of the configurable gate array. To overcome this difficulty, the present invention expands the original concept of the configurable gate array by making the fixed computing elements configurable.

OBJECTS AND ADVANTAGES

It is a principle object of the present invention to realize configurable computation.

It is a further object of the present invention to realize field-configurable computation.

It is a further object of the present invention to realize re-configurable computation.

It is a further object of the present invention to realize configurable computation for complex functions.

It is a further object of the present invention to provide a configurable processor with a greater computational complexity.

It is a further object of the present invention to provide a configurable processor with a higher computational density.

It is a further object of the present invention to provide a configurable gate array with a greater computational flexibility.

In accordance with these and other objects of the present invention, the present invention discloses a configurable processor.

SUMMARY OF THE INVENTION

The present invention discloses a configurable processor with an in-package look-up table (IP-LUT), i.e. an IP-LUT configurable processor. The preferred IP-LUT configurable processor comprises a plurality of configurable computing elements. Each configurable computing element comprises at least a programmable memory array on a memory die and at least an arithmetic logic circuit (ALC) on a logic die. The programmable memory array stores at least a portion of a look-up table (LUT) for a mathematical function, which includes numerical values related to said mathematical function (e.g. functional values and/or derivative values thereof), while the ALC performs arithmetic operations on selected data from the LUT. In general, the logic die comprises the ALCs of a plurality of configurable computing elements, while the memory die comprises the programmable memory arrays of another plurality of configurable computing elements. The logic die and memory die are located in a configurable computing-array package and communicatively coupled by a plurality of inter-die connections. Located in the configurable computing-array package, the LUT is referred to as in-package LUT (IP-LUT).

The preferred IP-LUT configurable processor uses memory-based computation (MBC), which realizes mathematical functions primarily with the LUT. Compared with the LUT used by the conventional processor, the IP-LUT used by the preferred IP-LUT configurable processor has a much larger capacity. Although arithmetic operations are still performed, the MBC only needs to calculate a polynomial to a much lower order because it uses a much larger IP-LUT as a starting point for computation. For the MBC, the fraction of computation done by the IP-LUT is more than the ALC.

Each usage cycle of the IP-LUT configurable processor comprises two stages: a configuration stage and a computation stage. In the configuration stage, the LUT for a desired mathematical function is written into the programmable memory array. In the computation stage, selected values of the mathematical function are read out from the programmable memory array. The IP-LUT configurable processor can realize field-configurable computation and re-configurable computation. For the field-configurable computation, a mathematical function is realized by writing its LUT into the programmable memory array in the field of use. For re-configurable computation, the programmable memory array is re-programmable and different mathematical functions can be realized by writing different LUTs for different mathematical functions thereto during different usage cycles. For example, during a first usage cycle, a first LUT for a first mathematical function is written into the re-programmable memory array; during a second usage cycle, a second LUT for a second mathematical function is written into the re-programmable memory array.

Because the logic die and the memory die are located in a same package, this type of vertical integration is referred to as 2.5-D integration. The 2.5-D integration has a profound effect on the computational density and computational complexity. For the conventional 2-D integration, the footprint of a conventional processor 00X is roughly equal to the sum of those of the ALU 100X and the LUT 200X. On the other hand, because the 2.5-D integration moves the LUT from aside to above, the IP-LUT configurable processor becomes smaller and computationally more powerful. In addition, the total LUT capacity of the conventional processor 00X is less than 100 Kb, whereas the total IP-LUT capacity for the IP-LUT configurable processor could reach 100 Gb. Consequently, a single IP-LUT configurable processor could support as many as 10,000 built-in functions (including various types of complex functions), far more than the conventional processor 00X. Furthermore, because the logic die and the memory die are separate dice, the logic transistors in the logic die and the memory transistors in the memory die are formed on separate semiconductor substrates. Consequently, their manufacturing processes can be individually optimized.

To further improve configurability, the present invention further discloses a preferred IP-LUT configurable computing array for implementing complex functions. It is a special type of the IP-LUT configurable processor and comprises an array of configurable computing elements, an array of configurable logic elements and a plurality of configurable interconnects. Each configurable computing element comprises at least a programmable memory array for storing the LUT for a mathematical function and at least an ALC for performing arithmetic operations on selected data from the LUT. The configurable logic elements and configurable interconnects in the IP-LUT configurable computing array are similar to those in the conventional configurable gate array. During computation, a complex function is first decomposed into a combination of basic functions. Each basic function is then realized by an associated configurable computing element. Finally, the complex function is realized by programming the corresponding configurable logic elements and configurable interconnects.

Accordingly, the present invention discloses a configurable processor including a plurality of configurable computing elements, each of said configurable computing elements comprising: at least a programmable memory array on a memory level for storing at least a portion of a look-up table (LUT) for a mathematical function; at least an arithmetic logic circuit (ALC) on a logic level for performing at least an arithmetic operation on selected data from said LUT, wherein said logic level is a different physical level than said memory level; and means for communicatively coupling said programmable memory array and said ALC; wherein said mathematical function includes more operations than arithmetic operations performable by said ALC.

The present invention further discloses another configurable processor for implementing a mathematical function, comprising: at least first and second programmable memory arrays on a memory level, wherein said first programmable memory array stores at least a first portion of a first look-up table (LUT) for a first mathematical function; and, said second programmable memory array stores at least a second portion of a second LUT for a second mathematical function; at least an arithmetic logic circuit (ALC) on a logic level for performing at least an arithmetic operation on selected data from said first or second LUT, wherein said logic level is a different physical level than said memory level; and means for communicatively coupling said first or second programmable memory array with said ALC; wherein said mathematical function is a combination of at least said first and second mathematical functions; and, each of said first and second mathematical functions includes more operations than arithmetic operations performable by said ALC.

The present invention further discloses a configurable computing array for implementing a mathematical function, comprising: at least an array of configurable logic elements including a configurable logic element, wherein said configurable logic element selectively realizes a logic function in a logic library; at least an array of configurable computing elements comprising at least a first programmable memory array, a second programmable memory array and an arithmetic logic circuit (ALC), wherein said first programmable memory array stores at least a first portion of a first look-up table (LUT) for a first mathematical function; said second programmable memory array stores at least a second portion of a second LUT for a second mathematical function; and, said ALC performs at least an arithmetic operation on selected data from said first or second LUT; means for communicatively coupling said configurable logic elements and said configurable computing elements; whereby said configurable computing array realizes said mathematical function by programming said configurable logic elements and said configurable computing elements, wherein said mathematical function is a combination of at least said first and second mathematical functions; wherein each of said first and second mathematical functions includes more operations than arithmetic operations included in said logic library; and, each of said first and second mathematical functions includes more operations than arithmetic operations performable by said ALC.

BRIEF DESCRIPTION OF THE DRAWINGS

FIG. 1A is a schematic view of a conventional processor (prior art); FIG. 1B lists all transcendental functions supported by an Intel Itanium (IA-64) processor (prior art);

FIG. 2A is a block diagram of a preferred IP-LUT configurable processor.

FIG. 5 is a block diagram of a first preferred IP-LUT configurable computing array;

Figure 2B:
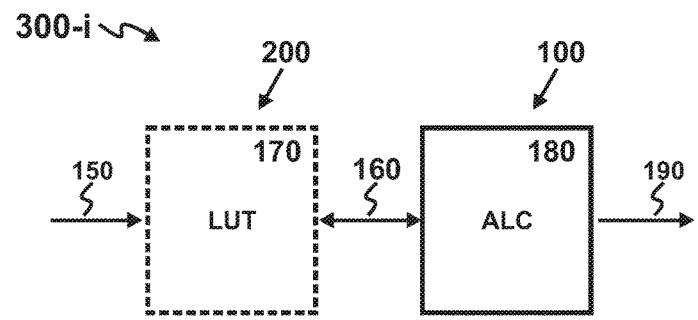
FIG. 2B is a block diagram of a preferred configurable computing element.

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments.

Throughout this specification, the phrase "mathematical functions" refer to non-arithmetic functions only; the phrase "memory" is used in its broadest sense to mean any semiconductor-based holding place for information, either permanent or temporary; the phrase "permanent" is used in its broadest sense to mean any long-term storage; the phrase "communicatively coupled" is used in its broadest sense to mean any coupling whereby information may be passed from one element to another element; the term "LUT" (or, "IP-LUT") could refer to the logic look-up table (LUT) stored in the programmable memory array(s), or the physical LUT circuit in the form of the programmable memory array(s), depending on the context; the symbol "/" means a relationship of "and" or "or".

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

Figure 2C:
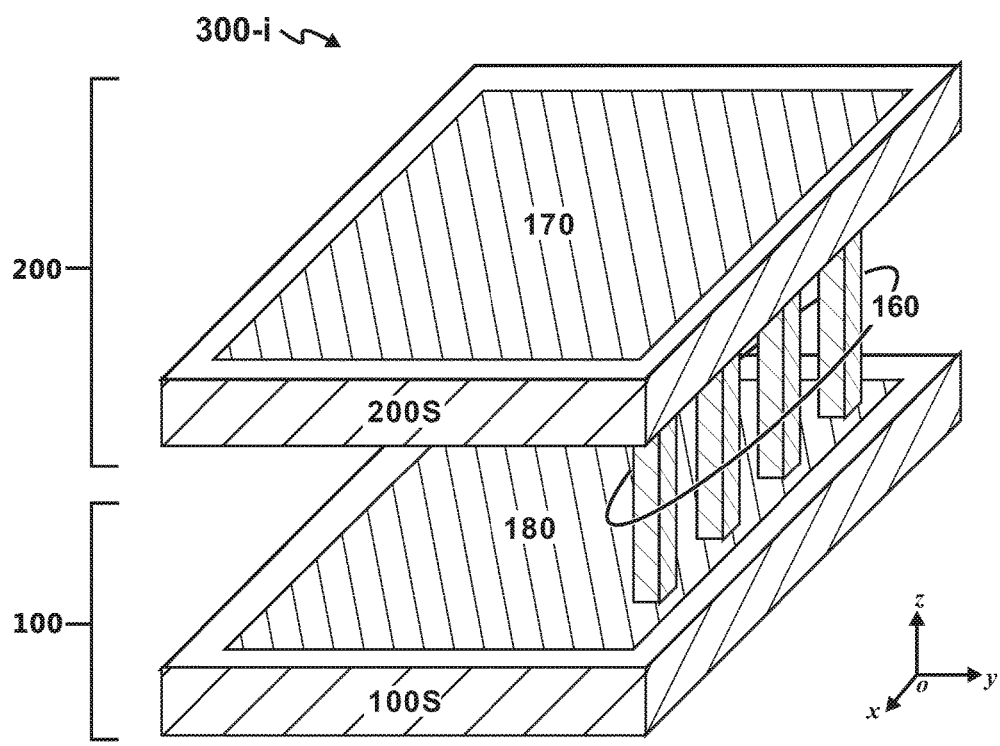
FIG. 2C is a perspective view of the preferred configurable computing element.

Referring now to FIG. 2A-2C, a preferred IP-LUT configurable processor 300 is disclosed. It comprises an array of configurable computing elements 300-1, 300-2 . . . 300-$i$ . . . 300-N (FIG. 2A). Each configurable computing element 300-$i$ could realize a same mathematical function or different mathematical functions. It has at least one input 150 and at least one output 190.

The configurable computing element 300-$i$ comprises at least a programmable memory array 170 and an arithmetic logic circuit (ALC) 180, which are communicatively coupled by connections 160 (FIG. 2B). The programmable memory array 170 stores at least a portion of the LUT for a mathematical function. It may be a RAM array or a ROM array. The RAM could be SRAM or DRAM, while the ROM could be OTP, EPROM, EEPROM, flash memory (e.g. planar NOR memory, planar NAND memory, or 3D-NAND memory), or 3D-XPoint memory. The LUT includes numerical values related to said mathematical function. Examples of the numerical values include the functional values or the derivative values of said mathematical function. The ALC 180 performs at least an arithmetic operation on selected data from the LUT. It may comprise an adder, a multiplier, and/or a multiply-accumulator (MAC). The ALC 180 may operate on integer, fixed-point numbers, or floating-point numbers. The mathematical function implemented by the programmable memory array 170 is a non-arithmetic function, which includes more operations than the arithmetic operations performable by the ALC 180. As disclosed before, typical arithmetical operations performable by the ALC 180 consist of addition, subtraction and multiplication.

Each usage cycle of the IP-LUT configurable processor 300 comprises two stages: a configuration stage and a computation stage. In the configuration stage, the LUT for a desired mathematical function is written into the programmable memory array 170. In the computation stage, selected values of the mathematical function are read out from the programmable memory array 170. The IP-LUT configurable processor 300 can be used to realize field-configurable computation and re-configurable computation. For the field-configurable computation, a mathematical function is realized by writing its LUT into the programmable memory array 170 in the field of use. For re-configurable computation, the programmable memory array 170 is re-programmable and different mathematical functions can be realized by writing different LUTs for different mathematical functions into the re-programmable memory array 170. For example, during a first usage cycle, a first LUT for a first mathematical function is written into the re-programmable memory array 170; during a second usage cycle, a second LUT for a second mathematical function is written into the re-programmable memory array 170.

In the preferred configurable computing element 300-$i$, the ALC 180 is formed on a logic die 100, while the programmable memory array 170 is formed on the memory die 200 (FIG. 2C). The logic die 100 is formed on a first semiconductor substrate 100S, while the memory die 200 is formed on a second semiconductor substrate 200S. In general, a single logic die 100 comprises the ALCs 180 of a plurality of configurable computing elements, while a single memory die 200 comprises the programmable memory arrays 170 of another plurality of configurable computing elements. The logic die 100 and memory die 200 are disposed in a same package and communicatively coupled by a plurality of inter-die connections 160. On a different physical level (e.g. a different die) than the ALC 180, the programmable memory array 170 is represented by dotted line in all figures.

The IP-LUT configurable processor 300 uses memory-based computation (MBC), which realizes mathematical functions primarily with the LUT. Compared with the LUT 200X used by the conventional processor 00X, the IP-LUT 170 used by the IP-LUT configurable processor 300 has a much larger capacity. Although arithmetic operations are still performed, the MBC only needs to calculate a polynomial to a much lower order because it uses a much larger IP-LUT 170 as a starting point for computation. For the MBC, the fraction of computation done by the IP-LUT 170 is more than the ALC 180.

Figure 3A:
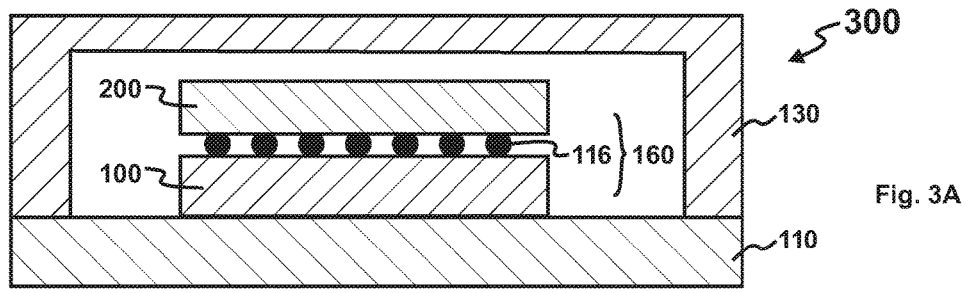
FIGS. 3A-3C are the cross-sectional views of three preferred IP-LUT configurable processor packages.
Figure 3B:
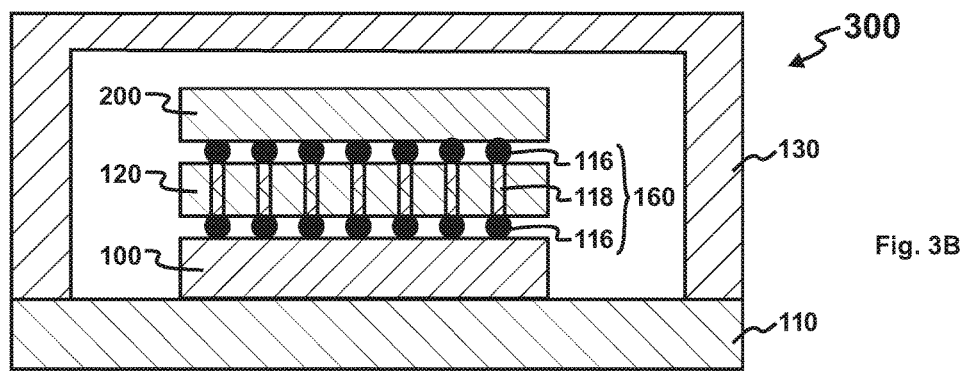
Figure 3C:
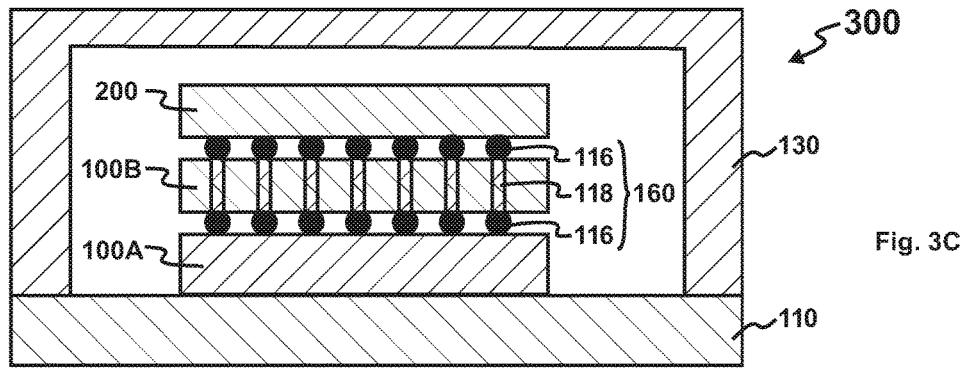
Figure 6:
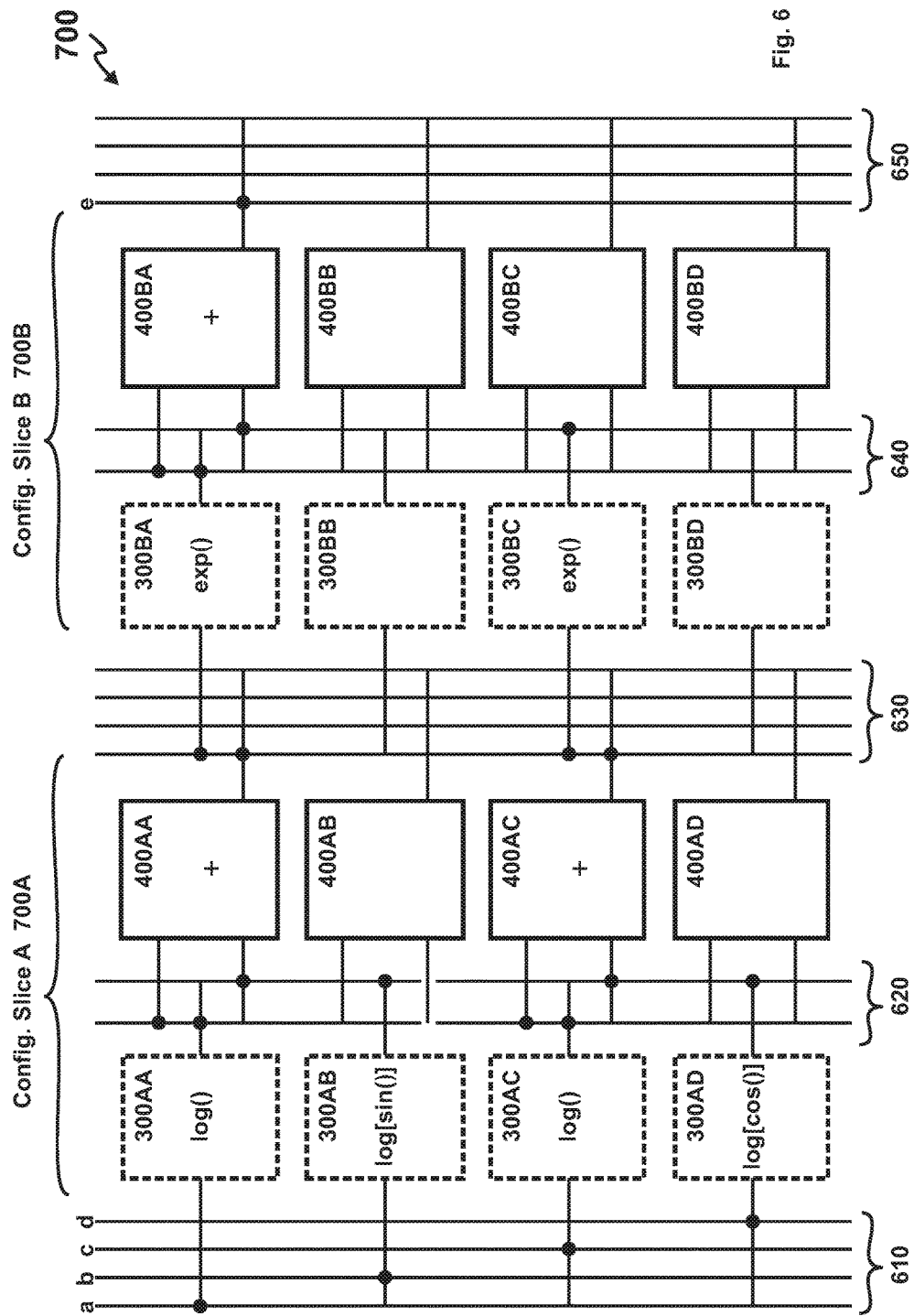
FIG. 6 shows an instantiation of the first preferred IP-LUT configurable computing array for implementing a complex function, i.e. $e = a \cdot \sin(b) + c \cdot \cos(d)$.

Referring now to FIGS. 3A-3C, the cross-sectional views of three preferred IP-LUT configurable processors 300 are shown. These preferred embodiments are located in multi-chip packages (MCP). Among them, the IP-LUT configurable processor package 300 in FIG. 3A comprises two separate dice: a logic die 100 and a memory die 200. The memory die 200 is stacked on top of the logic die 100, while the logic die 100 is stacked on the package substrate 110. The memory die 200 is flipped and bonded face-to-face with the logic die 100. Micro-bumps 116 act as the inter-die connections 160 and provide electrical coupling between the dice 100, 200. Both the memory die 200 and the logic die 100 are located in a same package 130. In this preferred embodiment, the memory die 200 comprises the programmable memory arrays 170 for a plurality of configurable computing elements, while the logic die 100 comprises the ALCs 180 for a plurality of configurable computing elements, as well as another plurality of configurable logic elements (as shown in FIGS. 5-6). Alternatively, the logic die 100 may be stacked on top of the memory die 200. Optionally, neither dice 100, 200 have to be flipped.

The IP-LUT configurable processor package 300 in FIG. 3B comprises a logic die 100, an interposer 120 and a memory die 200. The interposer 120 comprise a plurality of through-silicon vias (TSV) 118. The TSVs 118 provide electrical couplings between the logic die 100 and the memory die 200, offer more freedom in design and facilitate heat dissipation. In this preferred embodiment, the TSVs 118 and the micro-bumps 116 collectively form the inter-die connections 160.

The IP-LUT configurable processor package 300 in FIG. 3C comprises at least two logic dice 100A, 100B, and at least a memory die 200. These dice 100A, 100B, 200 are separate dice and they are located in a same package 130. The memory die 200 is stacked on top of the logic die 100B, and the logic die 100B is stacked on top of the logic die 100A. The dice 100A, 100B, 200 are electrically coupled with the TSVs 118 and the micro-bumps 116. In this preferred embodiment, the memory die 200 comprises the programmable memory arrays 170 for a plurality of configurable computing elements, the logic die 100B comprises the ALCs 180 for a plurality of configurable computing elements, while the logic die 100A comprises another plurality of configurable logic elements (as shown in FIGS. 5-6). Alternatively, the IP-LUT configurable processor 300 may comprise more than one memory die 200. In this case, the IP-LUT will have a large capacity than that in FIG. 3A. Similarly, the TSVs 118 and the micro-bumps 116 in this figure collectively form the inter-die connections 160.

Because the logic die 100 and the memory die 200 are located in a same package, this type of vertical integration is referred to as 2.5-D integration. The 2.5-D integration has a profound effect on the computational density and computational complexity. For the conventional 2-D integration, the footprint of a conventional processor 00X is roughly equal to the sum of those of the ALU 100X and the LUT 200X. On the other hand, because the 2.5-D integration moves the LUT from aside to above, the IP-LUT configurable processor 300 becomes smaller and computationally more powerful. In addition, the total LUT capacity of the conventional processor 00X is less than 100 Kb, whereas the total IP-LUT capacity for the IP-LUT configurable processor 300 could reach 100 Gb. Consequently, a single IP-LUT configurable processor 300 could support as many as 10,000 built-in functions (including various types of complex functions), far more than the conventional processor 00X. Moreover, the 2.5-D integration can improve the communication throughput between the IP-LUT 170 and the ALC 180. Because they are physically close and coupled by a large number of inter-die connections 160, the IP-LUT 170 and the ALC 180 have a larger communication throughput than that between the LUT 200X and the ALU 100X in the conventional processor 00X. Lastly, the 2.5-D integration benefits manufacturing process. Because the logic die 100 and the memory die 200 are separate dice, the logic transistors in the logic die 100 and the memory transistors in the memory die 200 are formed on separate semiconductor substrates. Consequently, their manufacturing processes can be individually optimized.

Figures 4A, 4C:
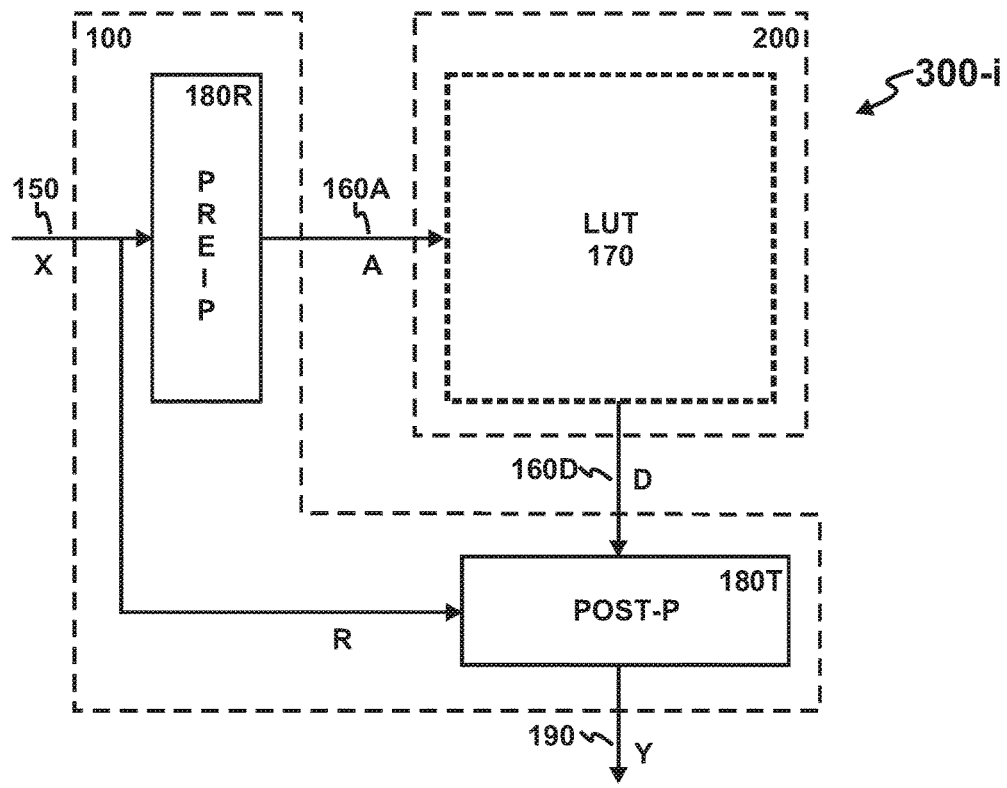
FIG. 4A is a circuit block diagram of a preferred configurable computing element showing more details.
FIG. 4C lists preferred LUT sizes and Taylor series required to realize mathematical functions with different precisions.
Figure 4B:
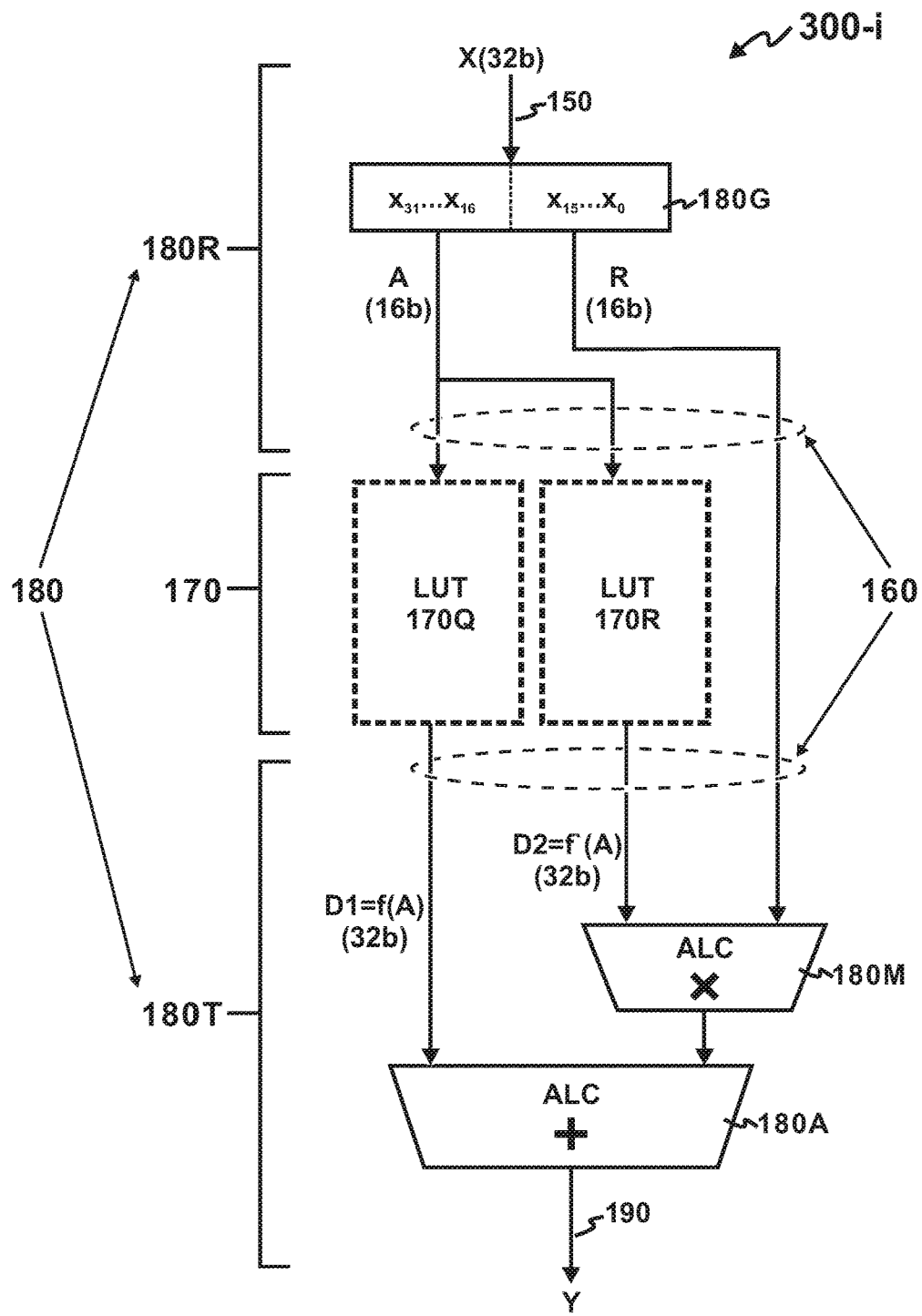
FIG. 4B is a circuit block diagram of the preferred configurable computing element realizing a single-precision function.

Referring now to FIGS. 4A-4C, more details on a preferred configurable computing element 300-$i$ are disclosed. It comprises a pre-processing circuit 180R, a post-processing circuit 180T and at least a programmable memory array 170 for storing the LUT(s) for a mathematical function. The pre-processing circuit 180R converts the input variable (X) 150 into an address (A) 160A of the programmable memory array 170. After the data (D) 160D at the address (A) is read out from the programmable memory array 170, the post-processing circuit 180T converts it into the output value (Y) 190. A residue (R) of the input variable (X) is fed into the post-processing circuit 180T to improve the computational precision. In this example, the pre-processing circuit 180R and the post-processing circuit 180T are formed in the logic die 100. Alternatively, at least a portion of the pre-processing circuit 180R and the post-processing circuit 180T may be formed in the memory die 200.

FIG. 4B shows a preferred configurable computing element 400 realizing a single-precision mathematical function Y=f(X). The IP-LUT 170 includes two LUTs 170Q, 170R with 2 Mb capacity each (16-bit input and 32-bit output): the LUT 170Q includes the functional value of the mathematical function, i.e. D1=f(A), while the LUT 170R includes the first-order derivative value of the mathematical function, i.e. D2=f'(A). The ALC 180 comprises a pre-processing circuit 180R (mainly comprising an address buffer) and a post-processing circuit 180T (comprising an adder 180A and a multiplier 180M). The inter-die connections 160 transfer data between the ALC 180 and the IP-LUT 170. During computation, a 32-bit input variable X ($x_{31} \ldots x_0$) is sent to the IP-LUT configurable processor 300 as an input 150. The pre-processing circuit 180R extracts the higher 16 bits ($x_{31} \ldots x_{16}$) and sends it as a 16-bit address input A to the IP-LUT 170. The pre-processing circuit 180R further extracts the lower 16 bits ($x_{15} \ldots x_0$) and sends it as a 16-bit input residue R to the post-processing circuit 180T. The post-processing circuit 180T performs a polynomial interpolation to generate a 32-bit output value Y 190. In this case, the polynomial interpolation is a first-order Taylor series: Y(X)=D1+D2*R=f(A)+f'(A)*R. Apparently, a higher-order polynomial interpolation (e.g. higher-order Taylor series) can be used to improve the computational precision.

When realizing a mathematical function, combining the LUT with polynomial interpolation can achieve a high precision without using an excessively large LUT. For example, if only LUT (without any polynomial interpolation) is used to realize a single-precision function (32-bit input and 32-bit output), it would have a capacity of $2^{32}*32=128$ Gb. By including polynomial interpolation, significantly smaller LUTs can be used. In the above embodiment, a single-precision function can be realized using a total of 4 Mb LUT (2 Mb for the functional values, and 2 Mb for the first-order derivative values) in conjunction with a first-order Taylor series. This is significantly less than the LUT-only approach (4 Mb vs. 128 Gb).

FIG. 4C lists preferred LUT sizes and Taylor series required to realize mathematical functions with different precisions. It uses a range-reduction method taught by Harrison. For the half precision (16 bit), the required IP-LUT capacity is $2^{16}*16=1$ Mb and no Taylor series is needed; for the single precision (32 bit), the required IP-LUT capacity is $2^{16}*32*2=4$ Mb and a first-order Taylor series is needed; for the double precision (64 bit), the required IP-LUT capacity is $2^{16}*64*3=12$ Mb and a second-order Taylor series is needed; for the extended double precision (80 bit), the required IP-LUT capacity is $2^{16}*80*4=20$ Mb and a third-order Taylor series is needed. To those skilled in the art, other combinations of LUT size and Taylor series can be used to optimize the LUT usage and arithmetic operations.

Besides transcendental functions, the preferred embodiment of FIGS. 4A-4B can be used to implement special functions. Special functions can be defined by means of power series, generating functions, infinite products, repeated differentiation, integral representation, differential difference, integral, and functional equations, trigonometric series, or other series in orthogonal functions. Important examples of special functions are gamma function, beta function, hyper-geometric functions, confluent hyper-geometric functions, Bessel functions, Legrendre functions, parabolic cylinder functions, integral sine, integral cosine, incomplete gamma function, incomplete beta function, probability integrals, various classes of orthogonal polynomials, elliptic functions, elliptic integrals, Lame functions, Mathieu functions, Riemann zeta function, automorphic functions, and others. The IP-LUT configurable processor will simplify the computation of special functions and promote their applications in scientific computation.

Referring now to FIGS. 5-6, a first preferred IP-LUT configurable computing array 700 is disclosed. It is a special type of the configurable processor 300 for implementing complex functions. The first preferred IP-LUT configurable computing array 700 comprises first and second configurable slices 700A, 700B. Each configurable slice (e.g. 700A) comprises a first array of configurable computing elements (e.g. 300AA-300AD) and a second array of configurable logic elements (e.g. 400AA-400AD). A configurable channel 620 is placed between the first array of configurable computing elements (e.g. 300AA-300AD) and the second array of configurable logic elements (e.g. 400AA-400AD). The configurable channels 610, 630, 650 are also placed between different configurable slices 700A, 700B. The configurable channels 610-650 comprise an array of configurable interconnects (represented by slashes at the cross-points in each configurable channel). For those skilled in the art, besides configurable channels, the sea-of-gates architecture may also be used.

The configurable computing elements 300AA-300BD are similar to those in the IP-LUT configurable processor 300 (FIG. 2B). Each configurable computing element 300-$i$ comprises at least a programmable memory array 170 and an arithmetic logic circuit (ALC) 180. It can realize at least a basic function by loading the LUT for said basic function into the programmable memory array 170. The configurable logic elements 400AA-400BD and the configurable interconnects 610-650 are similar to those disclosed in Freeman (U.S. Pat. No. 4,870,302). Each configurable logic element can selectively realize any one of a plurality of logic operations in a logic library. A typical logic library includes a group of operations consisting of shift, logic NOT, logic AND, logic OR, logic NOR, logic NAND, logic XOR, addition "+", and subtraction "−". Each configurable interconnect can selectively couple or de-couple at least one interconnect line.

The first preferred IP-LUT configurable computing array 700 can realize a complex function by programming the configurable logic elements 400AA-400BD and the configurable computing elements 300AA-300BD. The complex function is a combination of basic functions, which can be implemented by selected configurable computing elements. The mathematical operations included in each basic function are not only more than the arithmetic operations included in the logic library of the configurable logic elements 400AA-400BD, but also more than the arithmetic operations performable by the ALC 180. In general, the arithmetic operations included in the logic library consist of addition and subtraction; and, the arithmetic operations performable by the ALC 180 consist of addition, subtraction and multiplication.

In one preferred IP-LUT configurable computing array 700, the programmable memory arrays 170 of the configurable computing elements 300AA-300BD are located on a different physical level than the configurable logic elements 400AA-400BD. For example, the programmable memory arrays 170 are located on a memory die 200, while the configurable logic elements 400 are located on a logic die. This logic die could be the same logic die 100 for the ALC 180, as in the case of FIG. 3A. Alternatively, it could be a different logic die, as in the case of FIG. 3C where a first logic dice 100A is used for the configurable logic elements 400AA-400BD, and a second logic die 100B is used for the ALCs 180. The memory die and the logic die are vertically stacked and preferably at least partially overlap.

FIG. 6 discloses an instantiation of the first preferred IP-LUT configurable computing array 700 for implementing a complex function, i.e. e=a·sin(b)+c·cos(d). The configurable interconnects in the configurable channel 610-650 use the same convention as Freeman: the interconnect with a dot means that the interconnect is connected; the interconnect without dot means that the interconnect is not connected; a broken interconnect means that two broken sections are un-coupled. In this preferred instantiation, the configurable computing element 300AA is configured to realize the function log( ), whose result log(a) is sent to a first input of the configurable logic element 400AA. The configurable computing element 300AB is configured to realize the function log[sin( )], whose result log[sin(b)] is sent to a second input of the configurable logic element 400AA. The configurable logic element 400AA is configured to realize addition, whose result log(a)+log[sin(b)] is sent the configurable computing element 300BA. The configurable computing element 300BA is configured to realize the function exp( ), whose result exp{log(a)+log[sin(b)]}=a·sin(b) is sent to a first input of the configurable logic element 400BA. Similarly, through proper configurations, the results of the configurable computing elements 300AC, 300AD, the configurable logic elements 400AC, and the configurable computing element 300BC can be sent to a second input of the configurable logic element 400BA. The configurable logic element 400BA is configured to realize addition, whose result a·sin(b)+c·cos(d) is sent to the output e. Apparently, by changing its configuration, the IP-LUT configurable computing array 700 can realize other complex functions.

The first preferred IP-LUT configurable computing array 700 is particularly suitable for realizing complex functions. If only LUT is used to realize the above 4-variable function, i.e. e=a·sin(b)+c·cos(d), an enormous LUT is needed: $2^{16}*2^{16}*2^{16}*2^{16}*16=256$ Eb even for half precision, which is impractical. Using the IP-LUT configurable gate array 700, only 8 Mb LUT (including 8 configurable computing elements, each with 1 Mb capacity) is needed to realize a 4-variable function. To those skilled in the art, the first preferred IP-LUT configurable computing array 700 can be used to realize other complex functions.

Figure 7:
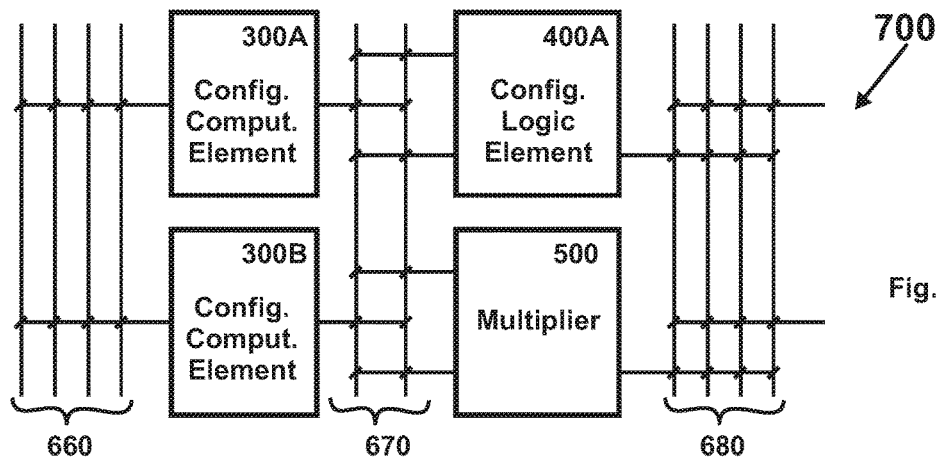
FIG. 7 is a block diagram of a second preferred IP-LUT configurable computing array.
Figure 8A:
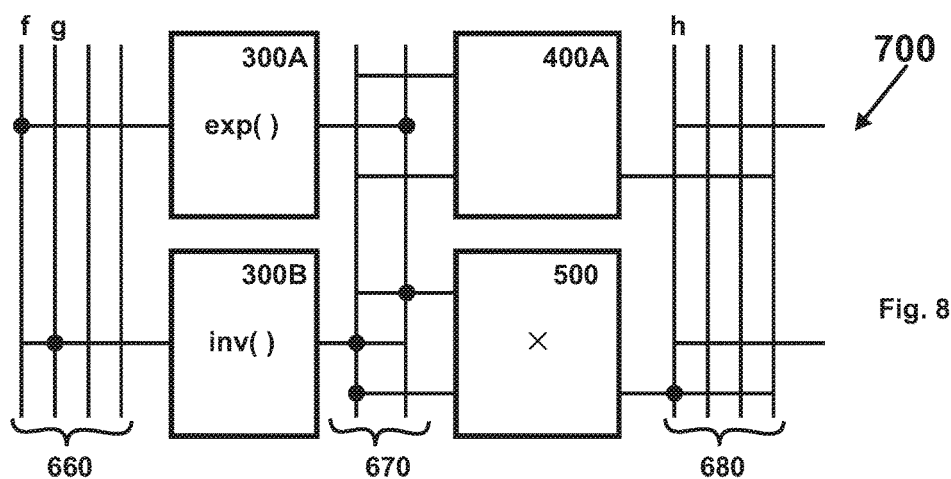
FIGS. 8A-8B show two instantiations of the second preferred IP-LUT configurable computing array.
Figure 8B:
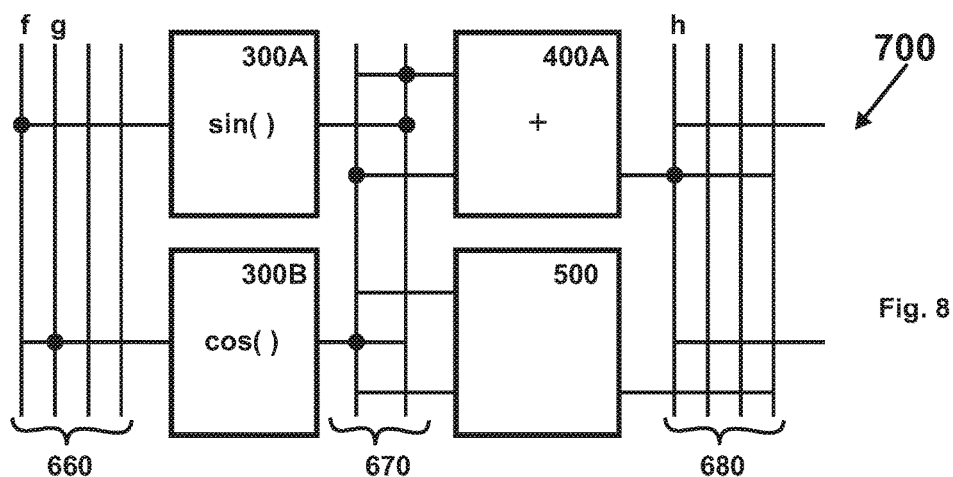

Referring now to FIGS. 7-8B, a second preferred IP-LUT configurable computing array 700 is shown. Besides configurable computing elements 300A, 300B and configurable logic element 400A, this preferred embodiment further comprises a multiplier 500. The configurable channels 660-680 comprise a plurality of configurable interconnects. With the addition of the multiplier 500, the second preferred IP-LUT configurable computing array 700 can realize more mathematical functions with more computational power.

FIGS. 8A-8B disclose two instantiations of the second preferred IP-LUT configurable computing array 700. In the instantiation of FIG. 8A, the configurable computing element 300A is configured to realize the function exp(f), while the configurable computing element 300B is configured to realize the function inv(g). The configurable channel 670 is configured in such a way that the outputs of 300A, 300B are fed into the multiplier 500. The final output is then h=exp(f)*inv(g). On the other hand, in the instantiation of FIG. 8B, the configurable computing element 300A is configured to realize the function sin(f), while the configurable computing element 300B is configured to realize the function cos(g). The configurable channel 670 is configured in such a way that the outputs of 300A, 300B are fed into the configurable logic element 400A, which is configured to realize arithmetic addition. The final output is then h=sin(f)+cos(g).

While illustrative embodiments have been shown and described, it would be apparent to those skilled in the art that many more modifications than that have been mentioned above are possible without departing from the inventive concepts set forth therein. For example, the IP-LUT configurable processor of the present invention could be a micro-controller, a controller, a central processing unit (CPU), a digital signal processor (DSP), a graphic processing unit (GPU), a network-security processor, an encryption/decryption processor, an encoding/decoding processor, a neural-network processor, or an artificial intelligence (AI) processor. These IP-LUT configurable processors can be found in consumer electronic devices (e.g. personal computers, video game machines, smart phones) as well as engineering and scientific workstations and server machines. The invention, therefore, is not to be limited except in the spirit of the appended claims.

What is claimed is:

1. A configurable processor including a plurality of configurable computing elements, each of said configurable computing elements comprising:
    at least a programmable memory array on a memory level for storing at least a portion of a look-up table (LUT) for a mathematical function;
    at least an arithmetic logic circuit (ALC) on a logic level for performing at least an arithmetic operation on selected data from said LUT, wherein said logic level is a different physical level than said memory level; and
    means for communicatively coupling said programmable memory array and said ALC;
    wherein said mathematical function includes more operations than arithmetic operations performable by said ALC.

2. The configurable processor according to claim 1, wherein said arithmetic operations performable by said ALC consist of addition, subtraction and multiplication.

3. The configurable processor according to claim 1, wherein said memory level is located on a memory die; and, said logic level is located on a logic die; said memory die and said logic die are vertically stacked.

4. The configurable processor according to claim 3, wherein said memory die and said logic die at least partially overlap.

5. The configurable processor according to claim 1, wherein said programmable memory array is a re-programmable memory array, whereby said configurable processor can be re-configured to realize different mathematical functions.

6. A configurable processor for implementing a mathematical function, comprising:
    at least first and second programmable memory arrays on a memory level, wherein said first programmable memory array stores at least a first portion of a first look-up table (LUT) for a first mathematical function; and, said second programmable memory array stores at least a second portion of a second LUT for a second mathematical function;

at least an arithmetic logic circuit (ALC) on a logic level for performing at least an arithmetic operation on selected data from said first or second LUT, wherein said logic level is a different physical level than said memory level; and means for communicatively coupling said first or second programmable memory array with said ALC;

wherein said mathematical function is a combination of at least said first and second mathematical functions; and, each of said first and second mathematical functions includes more operations than arithmetic operations performable by said ALC.

7. The configurable processor according to claim 6, wherein said arithmetic operations performable by said ALC consist of addition, subtraction and multiplication.

8. The configurable processor according to claim 6, wherein said memory level is located on a memory die; and, said logic level is located on a logic die; said memory die and said logic die are vertically stacked.

9. The configurable processor according to claim 8, wherein said memory die and said logic die at least partially overlap.

10. The configurable processor according to claim 6, wherein said first and second programmable memory arrays are re-programmable memory arrays, whereby said configurable processor can be re-configured to realize different mathematical functions.

11. A configurable computing array for implementing a mathematical function, comprising:

at least an array of configurable logic elements including a configurable logic element, wherein said configurable logic element selectively realizes a logic function in a logic library;

at least an array of configurable computing elements comprising at least a first programmable memory array, a second programmable memory array and an arithmetic logic circuit (ALC), wherein said first programmable memory array stores at least a first portion of a first look-up table (LUT) for a first mathematical function; said second programmable memory array stores at least a second portion of a second LUT for a second mathematical function; and, said ALC performs at least an arithmetic operation on selected data from said first or second LUT;

means for communicatively coupling said configurable logic elements and said configurable computing elements;

whereby said configurable computing array realizes said mathematical function by programming said configurable logic elements and said configurable computing elements, wherein said mathematical function is a combination of at least said first and second mathematical functions;

wherein each of said first and second mathematical functions includes more operations than arithmetic operations included in said logic library; and, each of said first and second mathematical functions includes more operations than arithmetic operations performable by said ALC.

12. The configurable computing array according to claim 11, wherein said arithmetic operations included in said logic library consist of addition and subtraction.

13. The configurable computing array according to claim 11, wherein said arithmetic operations performable by said ALC consist of addition, subtraction and multiplication.

14. The configurable computing array according to claim 11, further comprising at least a plurality of configurable interconnects including a configurable interconnect, wherein said configurable interconnect selectively realizes an interconnect from an interconnect library.

15. The configurable computing array according to claim 11, wherein said programmable memory array is a re-programmable memory array, whereby said configurable computing array can be re-configured to realize different mathematical functions.

16. The configurable computing array according to claim 11, wherein said first and second programmable memory array are located on a memory level; said configurable logic arrays are located on a logic level; and, said memory level and said logic level are different physical levels.

17. The configurable computing array according to claim 16, wherein said memory level is located on a memory die; said logic level is located on a logic die; and, said memory die and said logic die are vertically stacked.

18. The configurable computing array according to claim 17, wherein said memory die and said logic die at least partially overlap.

19. The configurable computing array according to claim 17, wherein said ALC is formed on said logic die.

20. The configurable computing array according to claim 17, wherein said ALC is formed on another logic die.

* * * * *